US009418715B1

(12) United States Patent
Jeon

(10) Patent No.: US 9,418,715 B1
(45) Date of Patent: Aug. 16, 2016

(54) SEMICONDUCTOR DEVICE

(71) Applicant: SK hynix Inc., Icheon-si Gyeonggi-do (KR)

(72) Inventor: Byung Deuk Jeon, Seongnam-si Gyeonggi-do (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/718,267

(22) Filed: May 21, 2015

(30) Foreign Application Priority Data

Jan. 26, 2015 (KR) .................. 10-2015-0011873

(51) Int. Cl.
*G11C 7/10* (2006.01)
*G11C 7/22* (2006.01)
*G11C 7/12* (2006.01)

(52) U.S. Cl.
CPC ............... *G11C 7/1057* (2013.01); *G11C 7/106* (2013.01); *G11C 7/1006* (2013.01); *G11C 7/1051* (2013.01); *G11C 7/1078* (2013.01); *G11C 7/12* (2013.01); *G11C 7/222* (2013.01); *G11C 7/1072* (2013.01)

(58) Field of Classification Search
CPC ...... G11C 7/1051; G11C 7/1078; G11C 7/22; G11C 7/1006; G11C 7/1072
USPC ............................. 365/189.05, 189.15, 189.16
See application file for complete search history.

(56) References Cited

U.S. PATENT DOCUMENTS

| | | | |
|---|---|---|---|
| 6,601,197 B1 | 7/2003 | Naritake | |
| 8,817,549 B2 * | 8/2014 | Shin | G11C 8/12 365/189.03 |
| 9,021,338 B2 * | 4/2015 | Joo | H03M 13/05 714/773 |
| 9,263,101 B2 * | 2/2016 | Kim | G11C 7/10 |
| 2015/0243345 A1 * | 8/2015 | Kim | G11C 11/4082 365/189.05 |

FOREIGN PATENT DOCUMENTS

KR 20100069367 A 6/2010

* cited by examiner

*Primary Examiner* — Pho M Luu
(74) *Attorney, Agent, or Firm* — William Park & Associates Ltd.

(57) ABSTRACT

A semiconductor device includes a buffer block configured to generate a strobe signal by buffering an external strobe signal inputted through a first pad, output the strobe signal to a first node of a first input/output line, generate data by buffering external data inputted through a second pad, and output the data to a second node of a second input/output line; a first channel configured to store the data loaded on the second input/output line in synchronization with the strobe signal loaded on the first input/output line; and a second channel configured to store the data loaded on the second input/output line in synchronization with the strobe signal loaded on the first input/output line.

24 Claims, 6 Drawing Sheets

SEMICONDUCTOR DEVICE

CROSS-REFERENCE TO RELATED APPLICATION

The present application claims priority under 35 U.S.C. §119(a) to Korean Patent Application No. 10-2015-0011873, filed on Jan. 26, 2015, in the Korean Intellectual Property Office, which is incorporated herein by reference in its entirety.

BACKGROUND

1. Technical Field

Embodiments of the invention relate to a semiconductor device.

2. Related Art

Recently, a semiconductor device is continuously requiring a higher band width to improve performance. In order to support a higher band width, the number of I/O (input/output) lines of the semiconductor device should be increased. The semiconductor device in which the number of I/O lines is increased in this way is referred to as a multi-channel wide I/O semiconductor device. The multi-channel wide I/O semiconductor device has a plurality of memory unit blocks, and the plurality of memory unit blocks may operate independently of one another without interference. The respective memory unit blocks are referred to as channels.

Meanwhile, in order to supply various internal signals and powers among a plurality of semiconductor devices stacked in an integrated circuit, bumps pads are used. Such bump pads are designed to have a diameter of several tens of micrometers (μm), for a high speed operation and a high degree of integration.

Since such bump pads with the size of several tens of micrometers (μm) are substantially small in their size to the extent that it is difficult to probe them using the probe pins of test equipment, a general semiconductor device separately includes probe pads which have a size larger than the bump pads, to be tested.

SUMMARY

In an embodiment, a semiconductor device may include a buffer block configured to generate a strobe signal by buffering an external strobe signal inputted through a first pad, output the strobe signal to a first node of a first input/output line, generate data by buffering external data inputted through a second pad, and output the data to a second node of a second input/output line. The semiconductor device may also include a first channel configured to store the data loaded on the second input/output line in synchronization with the strobe signal loaded on the first input/output line. The semiconductor device may also include a second channel configured to store the data loaded on the second input/output line in synchronization with the strobe signal loaded on the first input/output line.

In an embodiment, a semiconductor device may include a first input/output line including a first node to which a strobe signal is applied. The semiconductor device may also include a second input/output line including a second node to which data is applied. The semiconductor device may also include a first channel disposed in a first direction from the first and second nodes, and configured to store the data in synchronization with the strobe signal. The semiconductor device also includes a second channel disposed in a second direction from the first and second nodes, and configured to store the data in synchronization with the strobe signal.

In an embodiment, a semiconductor device includes a buffer block configured to generate and output a strobe signal to a node of a first input/output line and generate and output data to a node of a second input/output line. The semiconductor device also includes a first channel configured to latch the data in synchronization with the strobe signal and generate first latch data and store the first latch data. The semiconductor device also includes a second channel configured to latch the data in synchronization with the strobe signal and generate second latch data and store the latch data.

DETAILED DESCRIPTION

Hereinafter, a semiconductor device will be described below with reference to the accompanying figures through various embodiments. Various embodiments are directed to a semiconductor device which may perform a write operation through a bump pad or a probe pad and control setup/hold timings by channels. Further, various embodiments are directed to a semiconductor device in which data input paths of channels for performing a write operation may be realized to have the same loading.

Figure 1:
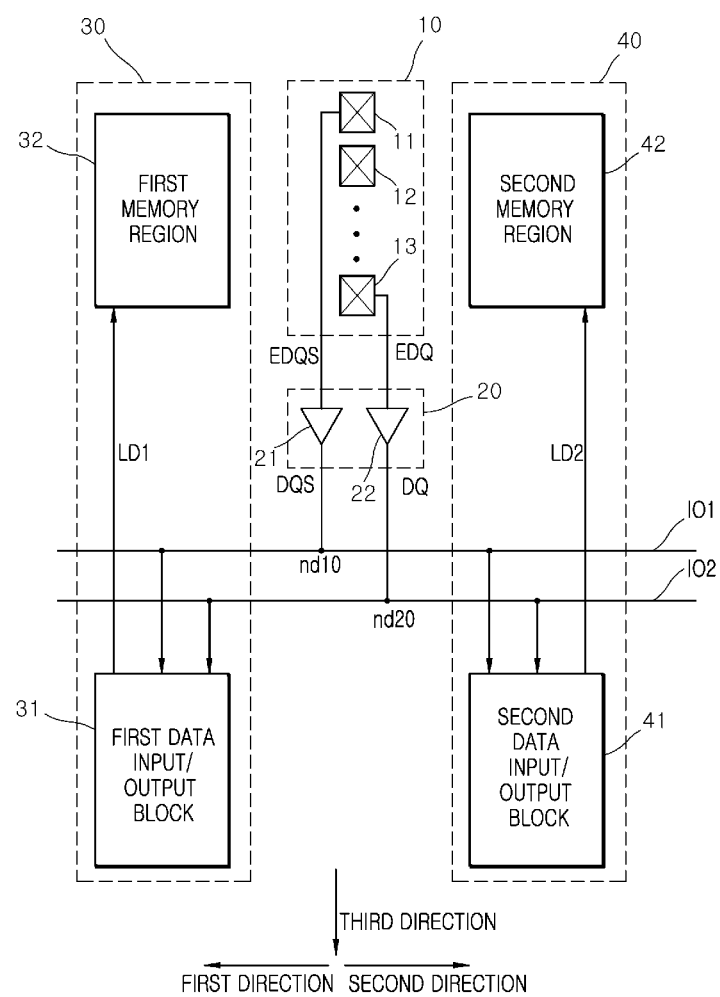
FIG. 1 is a block diagram illustrating the configuration of a semiconductor device in accordance with an embodiment.

Referring to FIG. 1, a semiconductor device in accordance with an embodiment may include a pad block 10, a buffer block 20, a first input/output line IO1, a second input/output line IO2, a first channel 30, and a second channel 40.

The pad block 10 may include a plurality of pads 11, 12, . . . and 13. The pad block 10 may receive an external strobe signal EDQS and external data EDQ through the plurality of pads 11, 12, . . . and 13 from an exterior. The plurality of pads 11, 12, . . . and 13 may be set as probe pads realized to have a size to be probed using the probe pins of test equipment.

Although it is illustrated that the external strobe signal EDQS is inputted through the pad 11 and the external data EDQ is inputted through the pad 13, it is to be noted that, according to an embodiment, each of the external strobe signal EDQS and the external data EDQ may be inputted through any one pad among the plurality of pads 11, 12, . . . and 13, regardless of order.

The buffer block 20 may include a first input buffer 21 and a second input buffer 22.

The first input buffer 21 may generate a strobe signal DQS by buffering the external strobe signal EDQS inputted through the pad 11. The first input buffer 21 may also output the strobe signal DQS to a node nd10 of the first input/output line IO1.

The second input buffer 22 may generate data DQ by buffering the external data EDQ inputted through the pad 13. The second input buffer 22 may also output the data DQ to a node nd20 of the second input/output line IO2.

The first input/output line IO1 may be set in such a manner that a loading value in a first direction (a leftward direction) from the node nd10 and a loading value in a second direction (a rightward direction) form the node nd10 are the same with each other. Further, the second input/output line IO2 may be set in such a manner that a loading value in the first direction (the leftward direction) from the node nd20 and a loading value in the second direction (the rightward direction) form the node nd20 are the same with each other. The first direction (the leftward direction) and the second direction (the rightward direction) may be set as opposite directions.

The first channel 30 may include a first data input/output block 31 and a first memory region 32. The first channel 30 may be disposed in the first direction (the leftward direction) from the buffer block 20.

The first data input/output block 31 may latch the data DQ loaded on the second input/output line IO2 in synchronization with the strobe signal DQS loaded on the first input/output line IO1. The first data input/output block 31 may also and generate first latch data LD1.

The first memory region 32 may store the first latch data LD1. The first memory region 32 may be realized by a volatile memory device or a nonvolatile memory device according to an embodiment.

The second channel 40 may include a second data input/output block 41 and a second memory region 42. The second channel 40 may be disposed in the second direction (the rightward direction) from the buffer block 20.

The second data input/output block 41 may latch the data DQ loaded on the second input/output line IO2 in synchronization with the strobe signal DQS loaded on the first input/output line IO1. The second data input/output block 41 may also generate second latch data LD2.

The second memory region 42 may store the second latch data LD2. The second memory region 42 may be realized by a volatile memory device or a nonvolatile memory device according to an embodiment.

Although the semiconductor device in accordance with the embodiment is realized to include the first and second channels 30 and 40, it is to be noted that, according to an embodiment, a multi-channel wide I/O semiconductor device may be realized to include a plurality of channels.

Figure 2:
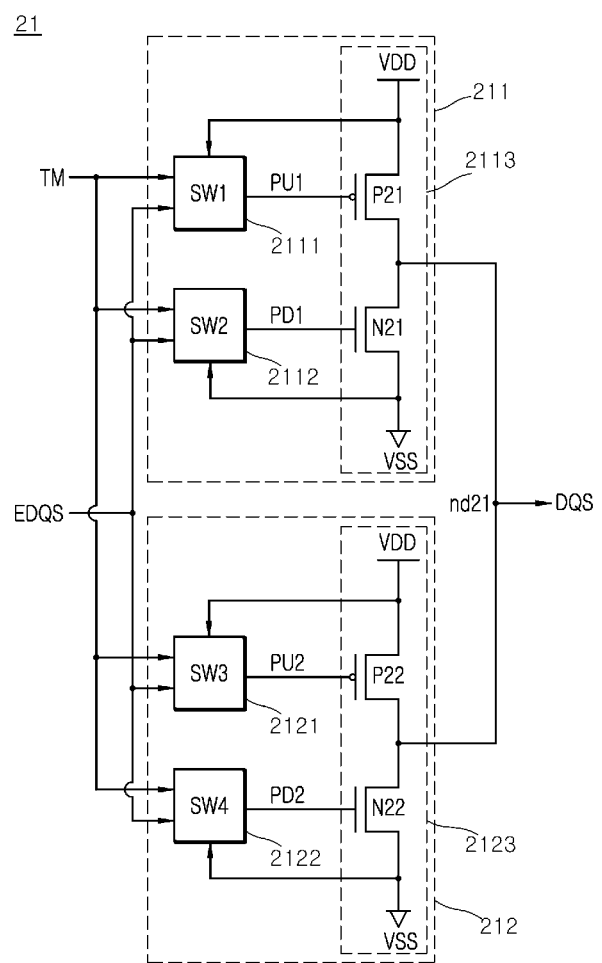
FIG. 2 is a diagram illustrating the configuration of the first input buffer included in the semiconductor device shown in FIG. 1.

Referring to FIG. 2, the first input buffer 21 may include a first buffer 211 and a second buffer 212.

The first buffer 211 may include a first switch 2111, a second switch 2112, and a first driving unit 2113.

The first switch 2111 may transfer the external strobe signal EDQS as a first pull-up signal PU1 where a test mode signal TM is enabled. The first switch 2111 may also transfer a power supply voltage VDD as the first pull-up signal PU1 where the test mode signal TM is disabled.

The second switch 2112 may transfer the external strobe signal EDQS as a first pull-down signal PD1 where the test mode signal TM is enabled. The second switch 2112 may also transfer a ground voltage VSS as the first pull-down signal PD1 where the test mode signal TM is disabled.

The first driving unit 2113 may include a first driving element P21 as a PMOS transistor positioned between the power supply voltage VDD and a node nd21 and receives the first pull-up signal PU1 through the gate thereof. The first driving unit 2113 may also include a second driving element N21 as an NMOS transistor positioned between the node nd21 and the ground voltage VSS and receives the first pull-down signal PD1 through the gate thereof. The first driving unit 2113 drives the node nd21 according to the levels of the first pull-up signal PU1 and the first pull-down signal PD1. The first driving unit 2113 also generates the strobe signal DQS.

In detail, operations of the first driving unit 2113 will be described below.

In the first driving unit 2113, in a test mode, the first driving element P21 is turned on and pull-up drives the node nd21 to the level of the power supply voltage VDD when the first pull-up signal PU1 is enabled to a logic low level. Further, the second driving element N21 is turned on and drives the node nd21 to the level of the ground voltage VSS when the first pull-down signal PD1 is enabled to a logic high level. In addition, in the first driving unit 2113, where the test mode is exited, the first driving element P21 is turned off by receiving the first pull-up signal PU1 with the level of the power supply voltage VDD. Further, the second driving element N21 is turned off by receiving the first pull-down signal PD1 with the level of the ground voltage VSS, by which the node nd21 is not driven.

The first buffer 211 may invert and buffer the external strobe signal EDQS and generate the strobe signal DQS in the test mode. In addition, the first buffer 211 may not drive the node nd21 and not generate the strobe signal DQS where the test mode is exited.

The second buffer 212 may include a third switch 2121, a fourth switch 2122, and a second driving unit 2123.

The third switch 2121 may transfer the external strobe signal EDQS as a second pull-up signal PU2 where the test mode signal TM is enabled. The third switch 2121 may also transfer the power supply voltage VDD as the second pull-up signal PU2 where the test mode signal TM is disabled.

The fourth switch 2122 may transfer the external strobe signal EDQS as a second pull-down signal PD2 where the test mode signal TM is enabled. The fourth switch 2122 may also transfer the ground voltage VSS as the second pull-down signal PD2 where the test mode signal TM is disabled.

The second driving unit 2123 may include a third driving element P22 as a PMOS transistor positioned between the power supply voltage VDD and the node nd21 and which receives the second pull-up signal PU2 through the gate thereof. The second driving unit 2123 may also include a fourth driving element N22 as an NMOS transistor positioned between the node nd21 and the ground voltage VSS and which receives the second pull-down signal PD2 through the gate thereof. The second driving unit 2123 drives the node nd21 according to the levels of the second pull-up signal PU2 and the second pull-down signal PD2. The second driving unit 2123 also generates the strobe signal DQS.

In detail, operations of the second driving unit 2123 will be described below.

In the second driving unit 2123, in the test mode, the third driving element P22 is turned on and pull-up drives the node nd21 to the level of the power supply voltage VDD when the second pull-up signal PU2 is enabled to a logic low level. Further, the fourth driving element N22 is turned on and drives the node nd21 to the level of the ground voltage VSS when the second pull-down signal PD2 is enabled to a logic high level. In addition, in the second driving unit 2123, where the test mode is exited, the third driving element P22 is turned off by receiving the second pull-up signal PU2 with the level of the power supply voltage VDD. Further, the fourth driving element N22 is turned off by receiving the second pull-down signal PD2 with the level of the ground voltage VSS, by which the node nd21 is not driven.

The second buffer 212 may invert and buffer the external strobe signal EDQS and generate the strobe signal DQS in the test mode. The second buffer 212 may also not drive the node nd21 and not generate the strobe signal DQS in where the test mode is exited.

The second input buffer 22 included in the buffer block 20 is realized as the same circuit and performs the same operations as the first input buffer 21 shown in FIG. 2 with the exception that only input/output signals are different, and thus, detailed descriptions thereof will be omitted.

Figure 3:
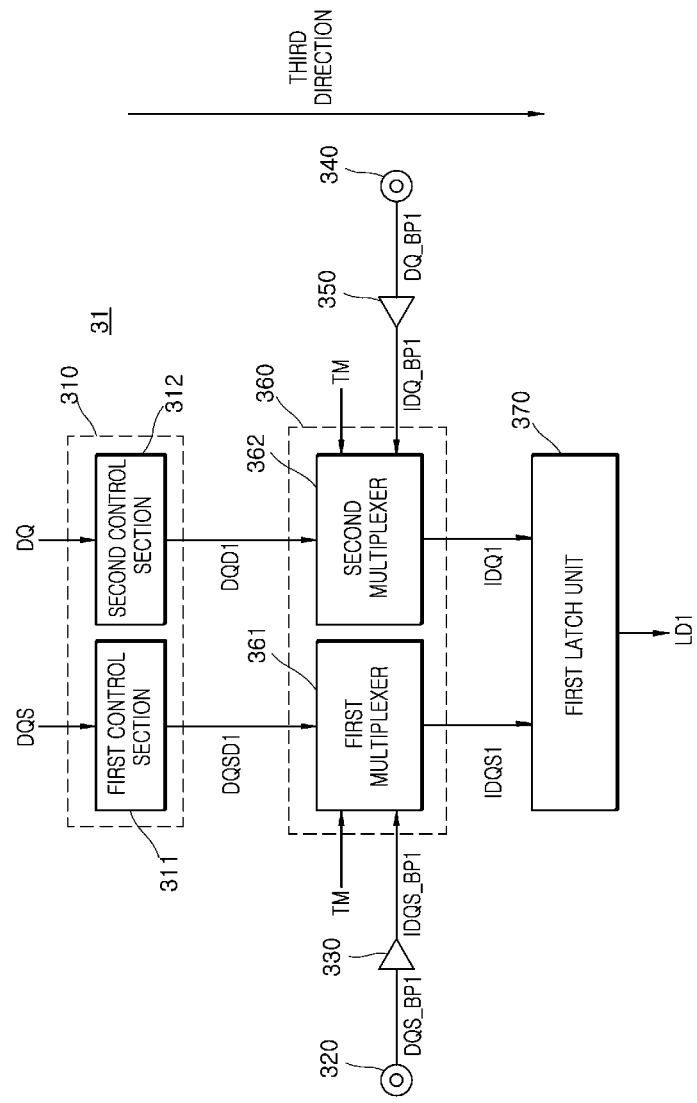
FIG. 3 is a block diagram illustrating the configuration of the first data input/output block included in the semiconductor device shown in FIG. 1.

Referring to FIG. 3, the first data input/output block 31 may include a first setup/hold timing control unit 310, a first bump pad 320, a third input buffer 330, a second bump pad 340, a fourth input buffer 350, a first selective transfer unit 360, and a first latch unit 370.

The first setup/hold timing control unit 310 may include a first control section 311 and a second control section 312.

The first control section 311 may buffer the strobe signal DQS with a preset driving force. The first control section 311 may also generate a first delayed strobe signal DQSD1 which is controlled in setup/hold timings. A setup timing represents a margin that allows the level of an input signal to have a stabilized value for a predetermined time before a preset point of time (for example, a rising or falling edge of a clock). Further, a hold timing represents a margin that allows an inputted signal to retain a stabilized value for a predetermined time after a preset point of time (for example, a rising edge or falling edge of a clock).

The second control section 312 may buffer the data DQ with a preset driving force. The second control section 312 may also generate first delayed data DQD1 which is controlled in setup/hold timings.

The third input buffer 330 may buffer a first bump strobe signal DQS_BP1 inputted through the first bump pad 320. The third input buffer 330 may also generate a first internal bump strobe signal IDQS_BP1. The first bump pad 320 is realized to have a diameter of several tens of micrometers (μm).

The third input buffer 330 is realized as the same circuit and performs the same operations as the first input buffer 21 shown in FIG. 2 with the exception that only input/output signals are different, and thus, detailed descriptions thereof will be omitted.

The fourth input buffer 350 may buffer first bump data DQ_BP1 inputted through the second bump pad 340. The fourth input buffer 350 may also generate first internal bump data IDQ_BP1. The second bump pad 340 is realized to have a diameter of several tens of micrometers (μm).

The fourth input buffer 350 is realized as the same circuit and performs the same operations as the first input buffer 21 shown in FIG. 2 with the exception that only input/output signals are different, and thus, detailed descriptions thereof will be omitted.

The first selective transfer unit 360 may include a first multiplexer 361 and a second multiplexer 362.

The first multiplexer 361 may transfer the first delayed strobe signal DQSD1 as a first internal strobe signal IDQS1 where the test mode signal TM is enabled. The first multiplexer 361 may also transfer the first internal bump strobe signal IDQS_BP1 as the first internal strobe signal IDQS1 where the test mode signal TM is disabled.

The second multiplexer 362 may transfer the first delayed data DQD1 as first internal data IDQ1 where the test mode signal TM is enabled. The second multiplexer 362 may also transfer the first internal bump data IDQ_BP1 as the first internal data IDQ1 where the test mode signal TM is disabled.

The first latch unit 370 may latch the first internal data IDQ1 in synchronization with the first internal strobe signal IDQS1. The first latch unit 370 may also output the latched first internal data IDQ1 as the first latch data LD1.

The first setup/hold timing control unit 310, the first selective transfer unit 360 and the first latch unit 370 may be disposed in a third direction perpendicular to the first direction (leftward direction), according to an embodiment. Further, the first setup/hold timing control unit 310, the first selective transfer unit 360 and the first latch unit 370 may be disposed in a direction parallel to the first direction (leftward direction) according to an embodiment.

Figure 4:
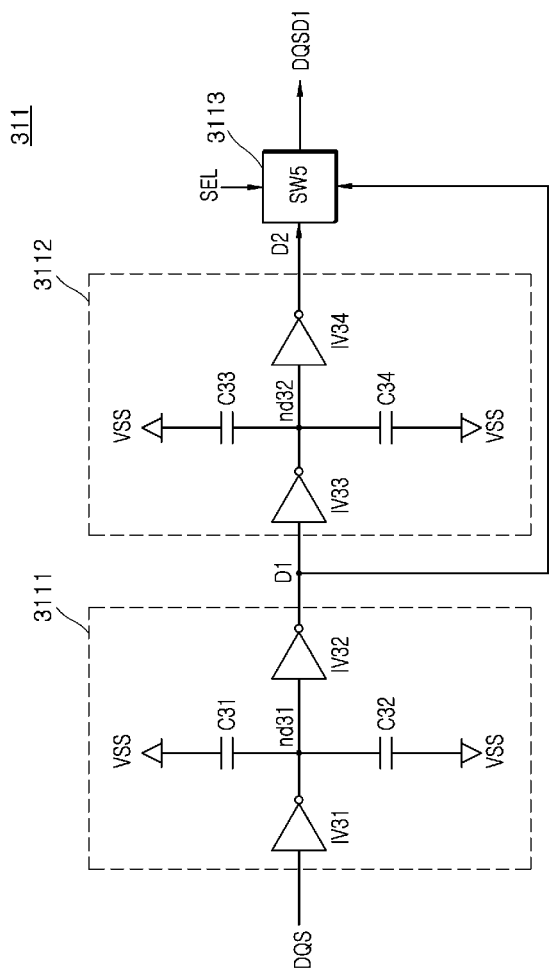
FIG. 4 is a circuit diagram illustrating the configuration of the first control section included in the first data input/output block shown in FIG. 3.

Referring to FIG. 4, the first control section 311 may include a first delay 3111, a second delay 3112, and a fifth switch 3113.

The first delay 3111 may include an inverter IV31 which inverts and buffers the strobe signal DQS and outputs a resultant signal to a node nd31, capacitors C31 and C32 which supply charges to the node nd31 according to amounts of charges, and an inverter IV32 which inverts and buffers the signal of the node nd31 and outputs a first delayed signal D1. In the first delay 3111, as the amounts of charges of the capacitors C31 and C32 are set according to various embodiments, the setup/hold timings of the first delayed signal D1 may be controlled in a variety of ways.

The second delay 3112 may include an inverter IV33 which inverts and buffers the first delayed signal D1. The inverter IV33 also outputs a resultant signal to a node nd32, capacitors C33 and C34 which supply charges to the node nd32 according to amounts of charges. The second delay 3112 may also include an inverter IV34 which inverts and buffers the signal of the node nd32 and outputs a second delayed signal D2. In the second delay 3112, as the amounts of charges of the capacitors C33 and C34 are set according to various embodiments, the setup/hold timings of the second delayed signal D2 may be controlled in a variety of ways.

The fifth switch 3113 may output the first delayed signal D1 or the second delayed signal D2 as the first delayed strobe signal DQSD1, according to a selection signal SEL. The selection signal SEL may be set as a signal inputted from an exterior to control the setup/hold timings of the first delayed strobe signal DQSD1.

The second control section 312 included in the first setup/hold timing control unit 310 is realized as the same circuit and performs the same operations as the first control section 311 shown in FIG. 4 with the exception that only input/output signals are different. Accordingly, detailed descriptions thereof will be omitted.

Figure 5:
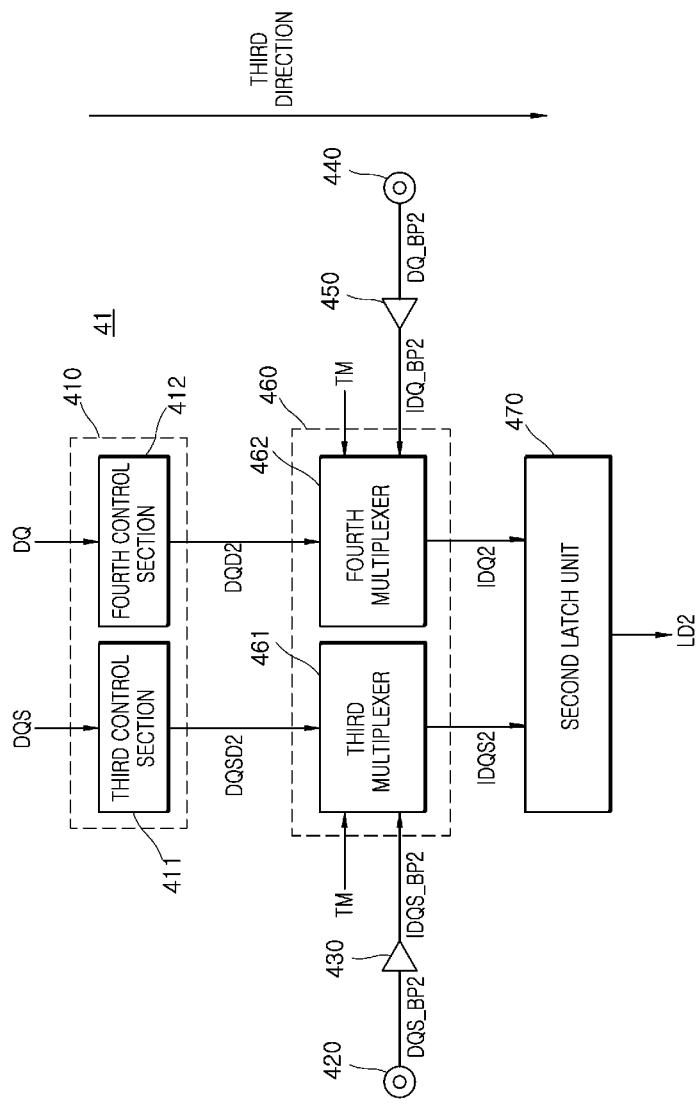
FIG. 5 is a block diagram illustrating the configuration of the second data input/output block included in the semiconductor device shown in FIG. 1.

Referring to FIG. 5, the second data input/output block 41 may include a second setup/hold timing control unit 410, a third bump pad 420, a fifth input buffer 430, a fourth bump pad 440, a sixth input buffer 450, a second selective transfer unit 460, and a second latch unit 470.

The second setup/hold timing control unit 410 may include a third control section 411 and a fourth control section 412.

The third control section 411 may buffer the strobe signal DQS with a preset driving force. The third control section 411 may also generate a second delayed strobe signal DQSD2 which is controlled in setup/hold timings.

The third control section 411 included in the second setup/hold timing control unit 410 is realized as the same circuit and performs the same operations as the first control section 311 shown in FIG. 4 with the exception that only input/output signals are different. Accordingly, detailed descriptions thereof will be omitted.

The fourth control section 412 may buffer the data DQ with a preset driving force. The fourth control section 412 may also generate second delayed data DQD2 which is controlled in setup/hold timings.

The fourth control section 412 included in the second setup/hold timing control unit 410 is realized as the same circuit and performs the same operations as the first control section 311 shown in FIG. 4 with the exception that only input/output signals are different. Therefore, detailed descriptions thereof will be omitted.

The fifth input buffer 430 may buffer a second bump strobe signal DQS_BP2 inputted through the third bump pad 420. The fifth input buffer 430 may also generate a second internal bump strobe signal IDQS_BP2.

The fifth input buffer 430 is realized as the same circuit and performs the same operations as the first input buffer 21 shown in FIG. 2 with the exception that only input/output signals are different. Accordingly, detailed descriptions thereof will be omitted.

The sixth input buffer 450 may buffer second bump data DQ_BP2 inputted through the fourth bump pad 440. The sixth input buffer 450 may also generate second internal bump data IDQ_BP2.

The sixth input buffer 450 is realized as the same circuit and performs the same operations as the first input buffer 21 shown in FIG. 2 with the exception that only input/output signals are different, and thus, detailed descriptions thereof will be omitted.

The second selective transfer unit 460 may include a third multiplexer 461 and a fourth multiplexer 462.

The third multiplexer 461 may transfer the second delayed strobe signal DQSD2 as a second internal strobe signal IDQS2 where the test mode signal TM is enabled. The third multiplexer 461 may also transfer the second internal bump strobe signal IDQS_BP2 as the second internal strobe signal IDQS2 where the test mode signal TM is disabled.

The fourth multiplexer 462 may transfer the second delayed data DQD2 as second internal data IDQ2 where the test mode signal TM is enabled. The fourth multiplexer 462 may also transfer the second internal bump data IDQ_BP2 as the second internal data IDQ2 where the test mode signal TM is disabled.

The second latch unit 470 may latch the second internal data IDQ2 in synchronization with the second internal strobe signal IDQS2. The second latch unit 470 may also output the latched second internal data IDQ2 as the second latch data LD2.

The second setup/hold timing control unit 410, the second selective transfer unit 460 and the second latch unit 470 may be disposed in the third direction perpendicular to the second direction (rightward direction), according to an embodiment. Further, the second setup/hold timing control unit 410, the second selective transfer unit 460 and the second latch unit 470 may be disposed in a direction parallel to the second direction (rightward direction) according to an embodiment.

Operations of the semiconductor device in accordance with an embodiment configured as mentioned above will be described below with reference to FIGS. 1 to 5, by being divided into the case where a write operation is performed through bump pads as the test mode is exited and the case where a write operation is performed through probe pads during the test mode. Operations of the first channel 30 will be described as an example.

First, descriptions will be made for the case where a write operation is performed through bump pads as the test mode is exited.

The first input buffer 21 does not buffer the external strobe signal EDQS inputted through the pad 11. The first input buffer 21 also does not generate the strobe signal DQS.

The second input buffer 22 does not buffer the external data EDQ inputted through the pad 13. The second input buffer 22 also does not generate the data DQ.

The first control section 311 of the first setup/hold timing control unit 310 does not generate the first delayed strobe signal DQSD1 since the strobe signal DQS is not generated.

The second control section 312 of the first setup/hold timing control unit 310 does not generate the first delayed data DQD1 since the data DQ is not generated.

The third input buffer 330 buffers the first bump strobe signal DQS_BP1 inputted through the first bump pad 320. The third input buffer 330 also generates the first internal bump strobe signal IDQS_BP1.

The fourth input buffer 350 buffers the first bump data DQ_BP1 inputted through the second bump pad 340. The fourth input buffer 350 also generates the first internal bump data IDQ_BP1.

The first multiplexer 361 of the first selective transfer unit 360 transfers the first internal bump strobe signal IDQS_BP1 as the first internal strobe signal IDQS1 since the test mode signal TM is disabled.

The second multiplexer 362 of the first selective transfer unit 360 transfers the first internal bump data IDQ_BP1 as the first internal data IDQ1 since the test mode signal TM is disabled.

The first latch unit 370 latches the first internal data IDQ1 in synchronization with the first internal strobe signal IDQS1. The first latch unit 370 also outputs the latched first internal data IDQ1 as the first latch data LD1.

The first memory region 32 stores the first latch data LD1.

The second channel 40 may perform a write operation through bump pads as the test mode is exited, in the same manner as the first channel 30. The first channel 30 and the second channel 40 may simultaneously perform write operations. Further, the first channel 30 and the second channel 40 may independently perform write operations.

The semiconductor device in accordance with an embodiment, configured as mentioned above, may perform a write operation through bump pads as the test mode is exited. In addition, as the first channel 30 and the second channel 40 respectively have components for controlling data setup/hold timings, data setup/hold timings may be controlled by channels.

Next, descriptions will be made for the case where a write operation is performed through probe pads in the test mode.

The first input buffer 21 buffers the external strobe signal EDQS inputted through the pad 11 and generates the strobe signal DQS. The first input buffer 21 also outputs the strobe signal DQS to the node nd10 of the first input/output line IO1.

The second input buffer 22 buffers the external data EDQ inputted through the pad 13 and generates the data DQ. The second input buffer 22 also outputs the data DQ to the node nd20 of the second input/output line IO2.

The first control section 311 of the first setup/hold timing control unit 310 buffers the strobe signal DQS with a preset driving force. The first control section 311 also generates the first delayed strobe signal DQSD1 which is controlled in setup/hold timings.

The second control section 312 of the first setup/hold timing control unit 310 buffers the data DQ with a preset driving force. The second control section 312 also generates the first delayed data DQD1 which is controlled in setup/hold timings.

The third input buffer 330 does not buffer the first bump strobe signal DQS_BP1 inputted through the first bump pad 320. The third input buffer 330 also does not generate the first internal bump strobe signal IDQS_BP1.

The fourth input buffer 350 does not buffer the first bump data DQ_BP1 inputted through the second bump pad 340. The fourth input buffer 350 also does not generate the first internal bump data IDQ_BP1.

The first multiplexer 361 of the first selective transfer unit 360 transfers the first delayed strobe signal DQSD1 as the first internal strobe signal IDQS1 since the test mode signal TM is enabled.

The second multiplexer 362 of the first selective transfer unit 360 transfers the first delayed data DQD1 as the first internal data IDQ1 since the test mode signal TM is enabled.

The first latch unit 370 latches the first internal data IDQ1 in synchronization with the first internal strobe signal IDQS1. The first latch unit 370 also outputs the latched first internal data IDQ1 as the first latch data LD1.

The first memory region 32 stores the first latch data LD1.

The second channel 40 may perform a write operation through probe pads in the test mode in the same manner as the first channel 30. The first channel 30 and the second channel 40 may simultaneously perform write operations. The first channel and the second channel 40 may also independently perform write operations.

The semiconductor device in accordance with an embodiment, configured as mentioned above, may perform a write operation through probe pads in the test mode. In addition, as the first channel 30 and the second channel 40 respectively have components for controlling data setup/hold timings, data setup/hold timings may be controlled by channels.

In the semiconductor device in accordance with embodiment, configured as mentioned above, it will be described below that data input paths between first and second channels which perform write operations are realized to have the same loading.

Referring once more to FIG. 1, the buffer block 20 is disposed in the third direction of the pad block 10.

The first channel 30 is disposed in the first direction (leftward direction) from the buffer block 20. Further, the second channel 40 is disposed in the second direction (rightward direction) from the buffer block 20. In other words, the first channel 30 and the second channel 40 are disposed in opposite directions.

Referring again to FIG. 3, the first setup/hold timing control unit 310, the first selective transfer unit 360 and the first latch unit 370 of the first channel 30 are disposed in the third direction perpendicular to the first direction (leftward direction).

Referring once more to FIG. 5, the second setup/hold timing control unit 410, the second selective transfer unit 460 and the second latch unit 470 of the second channel 40 are disposed in the third direction perpendicular to the second direction (rightward direction) according to an embodiment.

Namely, the data input path of the first channel 30 is disposed in the third direction perpendicular to the first direction (leftward direction) of the buffer block 20. Further, the data input path of the second channel 40 is disposed in the third direction perpendicular to the second direction (rightward direction) of the buffer block 20. As a result, the data input path of the first channel 30 and the data input path of the second channel 40 may be realized to have the same loading value when viewed from the buffer block 20.

As is apparent from the above descriptions, according to an embodiment, a write operation may be performed through a bump pad or a probe pad. In addition, it is possible to control setup/hold timings by channels.

Also, according to an embodiment, data input paths of channels for performing a write operation may be realized to have the same loading.

Figure 6:
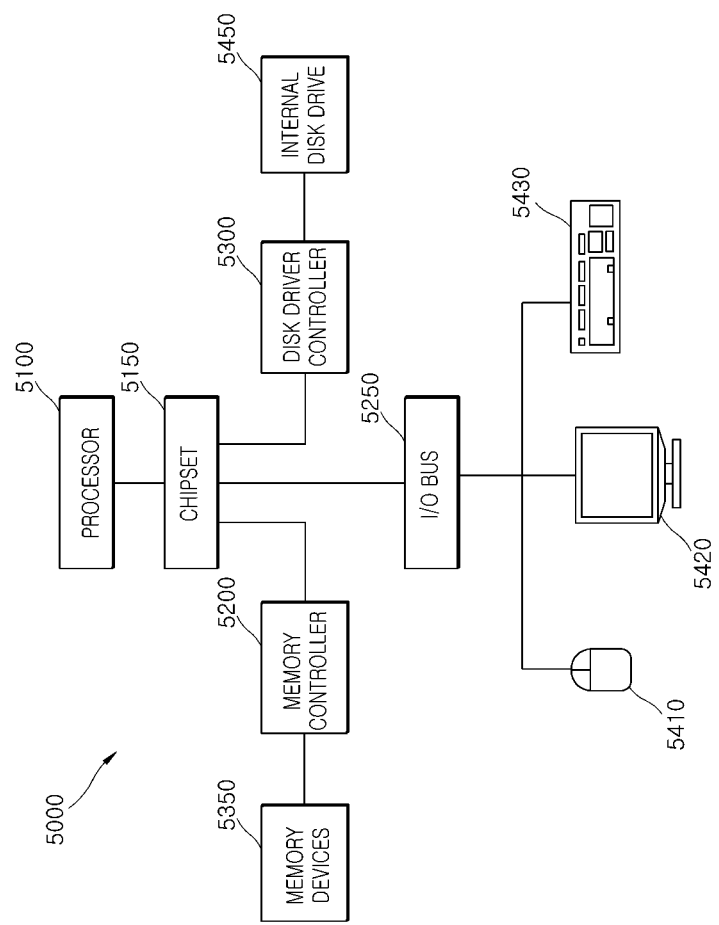
FIG. 6 illustrates a block diagram of a system employing a memory controller circuit in accordance with an embodiment of the invention.

Referring to FIG. 6, a system 5000 may include one or more processors 5100. The processor 5100 may be used individually or in combination with other processors. A chipset 5150 may be electrically coupled to the processor 5100. The chipset 5150 is a communication pathway for signals between the processor 5100 and other components of the system 5000. Other components may include a memory controller 5200, an input/output ("I/O") bus 5250, and a disk drive controller 5300. Depending on the configuration of the system 5000, any one of a number of different signals may be transmitted through the chipset 5150.

The memory controller 5200 may be electrically coupled to the chipset 5150. The memory controller 5200 can receive a request provided from the processor 5100 through the chipset 5150. The memory controller 5200 may be electrically coupled to one or more memory devices 5350. The memory devices 5350 may include the semiconductor device described above.

The chipset 5150 may also be electrically coupled to the I/O bus 5250. The I/O bus 5250 may serve as a communication pathway for signals from the chipset 5150 to I/O devices 5410, 5420 and 5430. The I/O devices 5410, 5420 and 5430 may include a mouse 5410, a video display 5420, or a keyboard 5430. The I/O bus 5250 may employ any one of a number of communications protocols to communicate with the I/O devices 5410, 5420, and 5430.

The disk drive controller 5300 may also be electrically coupled to the chipset 5150. The disk drive controller 5300 may serve as the communication pathway between the chipset 5150 and one or more internal disk drives 5450. The disk drive controller 5300 and the internal disk drives 5450 may communicate with each other or with the chipset 5150 using virtually any type of communication protocol.

While various embodiments have been described above, it will be understood to those skilled in the art that the embodiments described are by way of examples only. Accordingly, the semiconductor device described should not be limited based on the described embodiments above.

What is claimed is:

1. A semiconductor device comprising:
   a first input buffer configured to generate a strobe signal by buffering a external strobe signal, and output the strobe signal to a first node of a first input/output line;
   a second input buffer configured to generate a data by buffering a external data, and output the data to a second node of a second input/output line;
   a first channel configured to store the data loaded on the second input/output line in synchronization with the strobe signal loaded on the first input/output line; and
   a second channel configured to store the data loaded on the second input/output line in synchronization with the strobe signal loaded on the first input/output line.

2. The semiconductor device according to claim 1, wherein, on the first input/output line, a loading value in a first direction and a loading value in a second direction are equal with reference to the first node.

3. The semiconductor device according to claim 1, wherein, on the second input/output line, a loading value in a first direction and a loading value in a second direction are equal with reference to the second node.

4. The semiconductor device according to claim 1, wherein the first channel comprises:

a first data input/output block configured to generate first latch data by latching the data in synchronization with the strobe signal loaded on the first input/output line; and a first memory region configured to store the first latch data.

5. The semiconductor device according to claim 4, wherein the first data input/output block comprises:

a first setup/hold timing control unit configured to generate a first delayed strobe signal controlled in setup/hold timings by buffering the strobe signal with a preset driving force, and generate first delayed data controlled in the setup/hold timings by buffering the data with the preset driving force;

a first selective transfer unit configured to transfer the first delayed strobe signal or a first internal bump strobe signal as a first internal strobe signal, and transfer the first delayed data or first internal bump data as first internal data in response to a test mode signal; and a first latch unit configured to latch the first internal data in synchronization with the first internal strobe signal, and output the latched first internal data as the first latch data.

6. The semiconductor device according to claim 5, wherein the first setup/hold timing control unit, the first selective transfer unit and the first latch unit are disposed in a third direction perpendicular to the first direction.

7. The semiconductor device according to claim 5, wherein the first data input/output block further comprises:

a third input buffer configured to generate the first internal bump strobe signal by buffering a first bump strobe signal inputted through a first bump pad; and a fourth input buffer configured to generate the first internal bump data by buffering first bump data inputted through a second bump pad.

8. The semiconductor device according to claim 7, wherein the second channel comprises:

a second data input/output block configured to generate second latch data by latching the data in synchronization with the strobe signal loaded on the first input/output line; and a second memory region configured to store the second latch data.

9. The semiconductor device according to claim 8, wherein the second data input/output block comprises:

a second setup/hold timing control unit configured to generate a second delayed strobe signal controlled in an other setup/hold timings by buffering the strobe signal with a preset driving force, and generate second delayed data controlled in the other setup/hold timings by buffering the data with the preset driving force;

a second selective transfer unit configured to transfer the second delayed strobe signal or a second internal bump strobe signal, as a second internal strobe signal, and transfer the second delayed data or second internal bump data, as second internal data, in response to the test mode signal; and a second latch unit configured to latch the second internal data in synchronization with the second internal strobe signal, and output the latched second internal data as the second latch data.

10. The semiconductor device according to claim 9, wherein the second setup/hold timing control unit, the second selective transfer unit and the second latch unit are disposed in a third direction perpendicular to the second direction.

11. The semiconductor device according to claim 9, wherein the second data input/output block further comprises:

a fifth input buffer configured to generate the second internal bump strobe signal by buffering a second bump strobe signal inputted through a third bump pad; and a sixth input buffer configured to generate the second internal bump data by buffering second bump data inputted through a fourth bump pad.

12. A semiconductor device comprising:

a first input/output line including a first node to which a strobe signal is applied;

a second input/output line including a second node to which data is applied;

a first channel comprises:

a first data input/output block configured to generate first latch data by latching the data in synchronization with the strobe signal;

a first memory region configured to store the first latch data; and a second channel disposed in a second direction from the first and second nodes, and configured to store the data in synchronization with the strobe signal.

13. The semiconductor device according to claim 12, wherein, on the first input/output line, a loading value in the first direction and a loading value in the second direction are equal with reference to the first node.

14. The semiconductor device according to claim 12, wherein, on the second input/output line, a loading value in the first direction and a loading value in the second direction are equal with reference to the second node.

15. The semiconductor device according to claim 12, wherein the first data input/output block comprises:

a first setup/hold timing control unit configured to generate a first delayed strobe signal controlled in setup/hold timings, by buffering the strobe signal with a preset driving force, and generate first delayed data controlled in the setup/hold timings by buffering the data with the preset driving force;

a first selective transfer unit configured to transfer the first delayed strobe signal or a first internal bump strobe signal, as a first internal strobe signal, and transfer the first delayed data or first internal bump data, as first internal data, in response to a test mode signal; and a first latch unit configured to latch the first internal data in synchronization with the first internal strobe signal, and output the latched first internal data as the first latch data.

16. The semiconductor device according to claim 15, wherein the first setup/hold timing control unit, the first selective transfer unit and the first latch unit are disposed in a third direction perpendicular to the first direction.

17. The semiconductor device according to claim 15, wherein the second channel comprises:

a second data input/output block configured to generate second latch data by latching the data in synchronization with the strobe signal; and a second memory region configured to store the second latch data.

18. The semiconductor device according to claim 17, wherein the second data input/output block comprises:

a second setup/hold timing control unit configured to generate a second delayed strobe signal which is controlled in the setup/hold timings, by buffering the strobe signal with the preset driving force, and generate second delayed data controlled in the setup/hold timings by buffering the data with the preset driving force;

a second selective transfer unit configured to transfer the second delayed strobe signal or a second internal bump strobe signal, as a second internal strobe signal, and transfer the second delayed data or second internal bump data, as second internal data, in response to the test mode signal; and a second latch unit configured to latch the second internal data in synchronization with the second internal strobe signal, and output the latched second internal data as the second latch data.

19. The semiconductor device according to claim 18, wherein the second setup/hold timing control unit, the second selective transfer unit and the second latch unit are disposed in a third direction perpendicular to the second direction.

20. A semiconductor device comprising:

a buffer block configured to generate and output a strobe signal to a node of a first input/output line and generate and output data to a node of a second input/output line;

a first channel configured to latch the data in synchronization with the strobe signal and generate first latch data and store the first latch data; and a second channel configured to latch the data in synchronization with the strobe signal and generate second latch data and store the latch data, wherein the buffer block is configured to invert and buffer an external strobe signal and generate the strobe signal in a test mode.

21. The semiconductor device according to claim 20, further comprising:

a switch configured to transfer an external strobe signal as pull-up signal when a test mode signal is enabled, and transfer a power supply voltage as the pull-up signal when the test mode signal is disabled.

22. The semiconductor device according to claim 20, further comprising:

a switch configured to transfer an external strobe signal as a pull-down signal when a test mode signal is enabled and transfer a ground voltage as a pull-down signal when the test mode signal is disabled.

23. The semiconductor device according to claim 20, wherein the buffer block is configured to transfer an external strobe signal as pull-up signal or a pull-down signal when a test mode signal is enabled.

24. The semiconductor device according to claim 20, further comprising:

a setup/hold timing control unit configured to buffer the strobe signal with a preset driving force and generate a delayed strobe signal controlled in setup/hold timings.

* * * * *